(12) United States Patent
Huang et al.

(10) Patent No.: US 9,502,260 B2
(45) Date of Patent: Nov. 22, 2016

(54) METHOD FOR FORMING A SEMICONDUCTOR STRUCTURE

(71) Applicant: UNITED MICROELECTRONICS CORP., Hsin-Chu (TW)

(72) Inventors: Shih-An Huang, New Taipei (TW); Kun-Hsien Lee, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/599,559

(22) Filed: Jan. 19, 2015

(65) Prior Publication Data

US 2016/0189970 A1 Jun. 30, 2016

(30) Foreign Application Priority Data

Dec. 31, 2014 (CN) .......................... 2014 1 0848526

(51) Int. Cl.
*H01L 21/308* (2006.01)
*H01L 29/78* (2006.01)
*H01L 29/66* (2006.01)

(52) U.S. Cl.
CPC ....... *H01L 21/3081* (2013.01); *H01L 21/3086* (2013.01); *H01L 29/66636* (2013.01); *H01L 29/785* (2013.01)

(58) Field of Classification Search
None
See application file for complete search history.

(56) References Cited

U.S. PATENT DOCUMENTS

| | | | | |
|---|---|---|---|---|
| 4,421,785 A * | 12/1983 | Kroger | ............... | H01L 39/2493 148/DIG. 89 |
| 7,435,683 B2 | 10/2008 | Kavalieros | | |
| 2005/0285161 A1* | 12/2005 | Kang | ............... | H01L 29/42384 257/288 |
| 2011/0233679 A1* | 9/2011 | Chen | ............... | H01L 21/82343 257/368 |
| 2013/0154029 A1* | 6/2013 | Cai | ................... | H01L 29/66795 257/402 |
| 2014/0048886 A1 | 2/2014 | Chuang | | |
| 2014/0273377 A1* | 9/2014 | Kim | ....................... | H01L 29/16 438/283 |

* cited by examiner

*Primary Examiner* — Calvin Choi
*Assistant Examiner* — Xiaoming Liu
(74) *Attorney, Agent, or Firm* — Winston Hsu; Scott Margo

(57) ABSTRACT

The present invention provides a method for forming a semiconductor structure, including: firstly, providing a substrate, a fin structure being disposed on the substrate, a gate structure crossing over the fin structure, and a first hard mask being disposed on the top surface of the gate structure. Next, a dielectric layer is formed, covering the substrate, the fin structure and the gate structure. Afterwards, a second hard mask is formed on the top surface of the first hard mask, where the width of the second hard mask is larger than the width of the first hard mask, a bottom surface of the second hard mask and a top surface of the first hard mask are on the same level. An etching process is then performed to remove parts of the dielectric and parts of the fin structure.

14 Claims, 5 Drawing Sheets

METHOD FOR FORMING A SEMICONDUCTOR STRUCTURE

BACKGROUND OF THE INVENTION

1. Field of the Invention

The present invention relates to semiconductor technologies, in particular, to a method for improving the yield of a fin field effect transistor (FinFET).

2. Description of the Prior Art

With increasing miniaturization of semiconductor devices, various Fin-shaped field effect transistor (FinFET) devices have been developed. The Fin-shaped field effect transistor (FinFET) is advantageous for the following reasons. First, manufacturing processes of Fin-shaped field effect transistor (FinFET) devices can be integrated into traditional logic device processes, and thus are more compatible. In addition, since the three-dimensional structure of the FinFET increases the overlapping area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased.

In a current FinFET process, agate structure (which may include a gate dielectric layer, a gate electrode located on the gate dielectric layer, a cap layer located on the gate electrode, and a spacer located beside the gate dielectric layer, the gate electrode and the cap layer) is formed on a substrate having at least a fin-shaped structure. Then, epitaxial layers are formed on the fin-shaped structure beside the gate structure. Thereafter, other processes such as removing spacers of the gate structure may be performed.

However, the epitaxial layers make removal of the spacers difficult. The distance between the epitaxial layers on either side of the gate structure is also too great, resulting in insufficient stress forcing the gate channel below the gate structure, and limited ability to enhance carrier mobility of the gate channel through the epitaxial layers.

U.S. Pat. No. 7,435,683 provides a method for forming a semiconductor structure, and the semiconductor structures are shown in FIGS. 1-3. Firstly, a substrate 10 is provided, a fin structure 12 is formed on the substrate 10. Next, a gate structure 14 is formed on the fin structure 12, and a hard mask 16 is further formed on the top surface gate structure 14. Afterward, a dielectric layer 18 is formed to entirely cover the fin structure 12, the gate structure 14, and the hard mask 16.

Next, as shown in FIG. 2, an etching back process is performed, to partially remove the dielectric layer 18, and to expose the top surface and parts of the sidewall of the hard mask 16. Afterwards, a hard mask 20 is conformally formed to cover the surface of the dielectric layer 18, and further cover the top surface and partial sidewall of the hard mask 16.

Afterwards, as shown in FIG. 3, an etching process is performed, such as an anisotropic dry etching process, to remove parts of the hard mask 20, so as to form a sail shaped spacer 22 on the dielectric layer 18. The spacer 22 can protect the elements dispose below, especially preventing the gate structure 14 from being destroyed during the etching process in the following steps. Next, the spacer 22 is used as the hard mask, and another etching process is performed to partially remove the dielectric layer 18, and a spacer 24 is formed, covering two sidewalls of the gate structure 14. It is noteworthy that the spacer 24 is a truncated-sail shaped structure, and the epitaxial layer (not shown) is then formed on two sides of the gate structure in the following steps. It will not be described in detail here.

The method mentioned above can remove the dielectric layer which remains beside the epitaxial layer clearly. However, the thickness of the spacer 24 which is disposed on two sides of the gate structure is still influenced by the thickness of the spacer 22, and cannot be controlled well. Therefore, the method mentioned above still needs be improved.

SUMMARY OF THE INVENTION

The present invention provides a method for forming a semiconductor structure, comprising the following steps: firstly, a substrate is provided, a fin structure is disposed on the substrate, a gate structure crosses over the fin structure, and a first hard mask is disposed on the top surface of the gate structure; next, a dielectric layer is formed, covering the substrate, the fin structure and the gate structure; afterwards, a second hard mask is formed on the top surface of the first hard mask, wherein the width of the second hard mask is larger than the width of the first hard mask, and a bottom surface of the second hard mask and a top surface of the first hard mask are on the same level; and an etching process is then performed to remove parts of the dielectric and parts of the fin structure.

The feature of the present invention is besides the conventional hard mask, the invention further comprises the use of a wider second hard mask on the top surface of the hard mask. The second hard mask not only protects the gate structure disposed below effectively, and ensures the dielectric layer which remains on the substrate can be removed clearly, but also controls the width of the spacer disposed on two sides of the gate structure by adjusting the width of the second hard mask. Therefore, compared with conventional process, the height of hard mask does not need to be increased, and the issues can be solved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
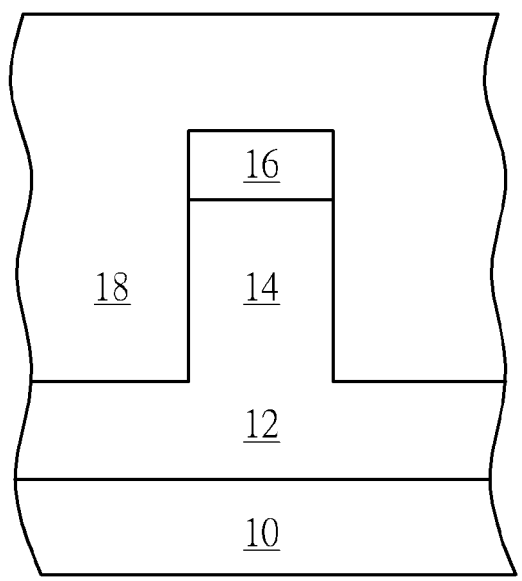
FIGS. 1-3 are the schematic diagrams showing a method for forming a semiconductor structure of U.S. Pat. No. 7,435,683.
Figure 2:
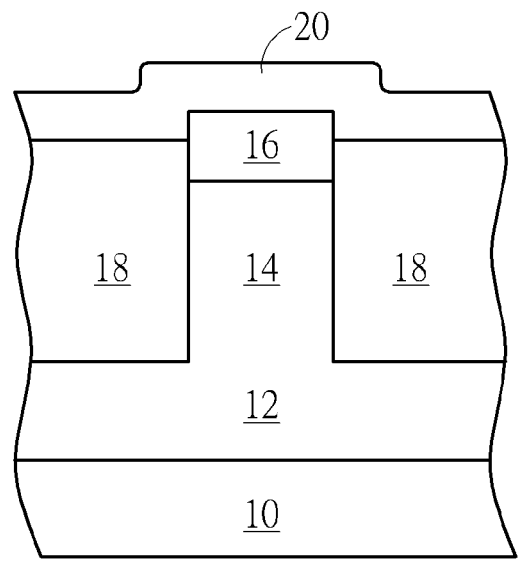
Figure 3:
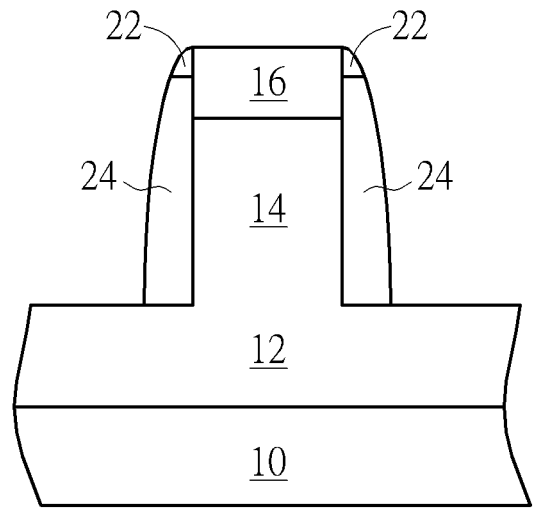
Figure 4:
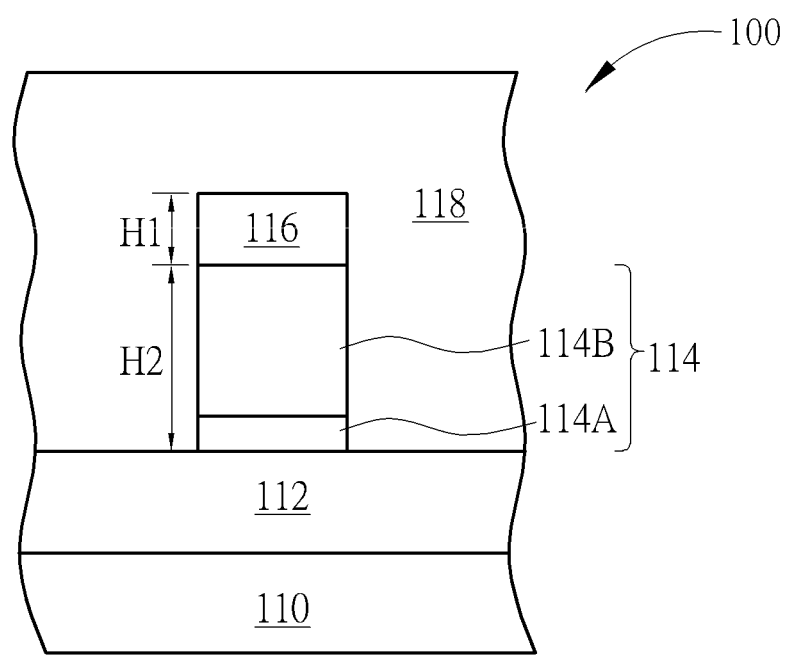
FIGS. 4-9 are the schematic diagrams showing a method for forming a semiconductor structure of the present invention.

FIGS. 4-9 are the cross section diagrams of the semiconductor structure of the present invention. As shown in FIG. 4, the method for forming a semiconductor structure 100 of the present invention at least comprises: first, a substrate 110 is provided, at least one fin structure 112 is disposed on the substrate 110, a gate structure 114 crosses the fin structure 112, and a first hard mask 116 is disposed on the top surface of the gate structure 114, wherein the gate structure 114 mainly comprises a conductive layer 114B and a gate dielectric layer 114A. Afterwards, a dielectric layer 118 is formed, to entirely cover the fin structure 112, the gate structure 114, and the first hard mask 116. The material of the substrate 110 comprises silicon substrate, silicon-containing substrate or silicon-on-insulator (SOI) substrate; the material of the fin structure 112 mainly comprises silicon; the conductive layer 114B of the gate structure 114 such as doped or un-doped polysilicon, or metals such tungsten, tantalum, titanium/nitride and alloys thereof, or the combination of the polysilicon and the metals in another embodiment of the present invention. The material of the gate dielectric layer 114A comprises an oxide layer or a high-k layer, wherein the high-k layer may include a single-layer or a multi-layer structure and the dielectric constant is substantially greater than 20, such as hafnium oxide ($HfO_2$), hafnium silicon oxide (HfSiO), hafnium silicon oxynitride (HfSiON), aluminum oxide (AlO), lanthanum oxide ($La_2O_3$), lanthanum aluminum oxide (LaAlO), tantalum oxide, $Ta_2O_3$, zirconium oxide ($ZrO_2$), zirconium silicon oxide (ZrSiO) or hafnium zirconium oxide (HfZrO). The material of the first hard mask 116 may include silicon oxide or silicon nitride. In this embodiment, the first hard mask 116 is a silicon oxide layer. The material of the dielectric layer 118 may include silicon oxide, silicon nitride, silicon oxynitride, hafnium oxide or titanium oxide, and in this embodiment, the dielectric layer 118 is a silicon nitride layer. In addition, the dielectric layer 118 can be formed through some methods well-known in the art, such as plasma enhanced chemical vapor deposition (PECVD) process, a high density chemical vapor deposition (HDCVD) process or a sputtering process.

Besides, the ratio of the height of the first hard mask to the height of the gate structure is preferably smaller than a specific value. For example, as shown in FIG. 4, the height H1 of the first hard mask 116 preferably between 100-300 angstroms, and the height H2 of the gate structure 114 preferably between 300-900 angstroms. Therefore, in this embodiment, the ratio of the height H1 of the first hard mask 116 to the height H2 of the gate structure 114 is preferably smaller than/equal to 0.3, but not limited thereto, and it can be adjusted according to actual requirements.

Figure 5:
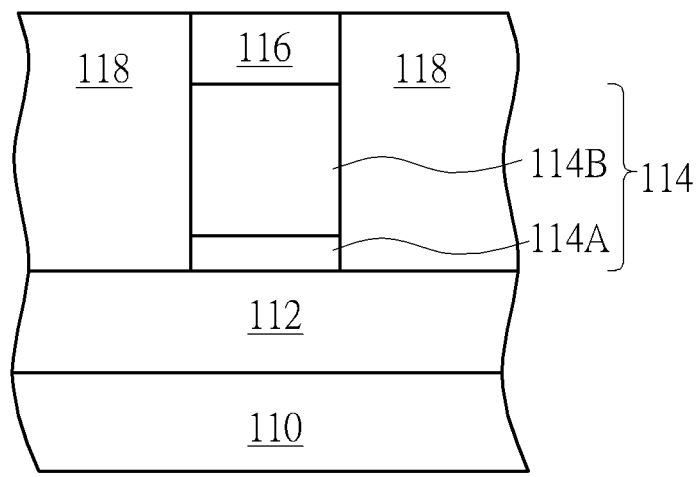

Next, as shown in FIG. 5, a planarization process is then performed on the dielectric layer 118, such as a chemical mechanical planarization (CMP), so as to remove parts of the dielectric layer 118, and to expose the top surface of the first hard mask 116. It is noteworthy that the top surface of the dielectric layer 118 and the top surface of the first hard mask 116 are on a same level.

Figure 6:
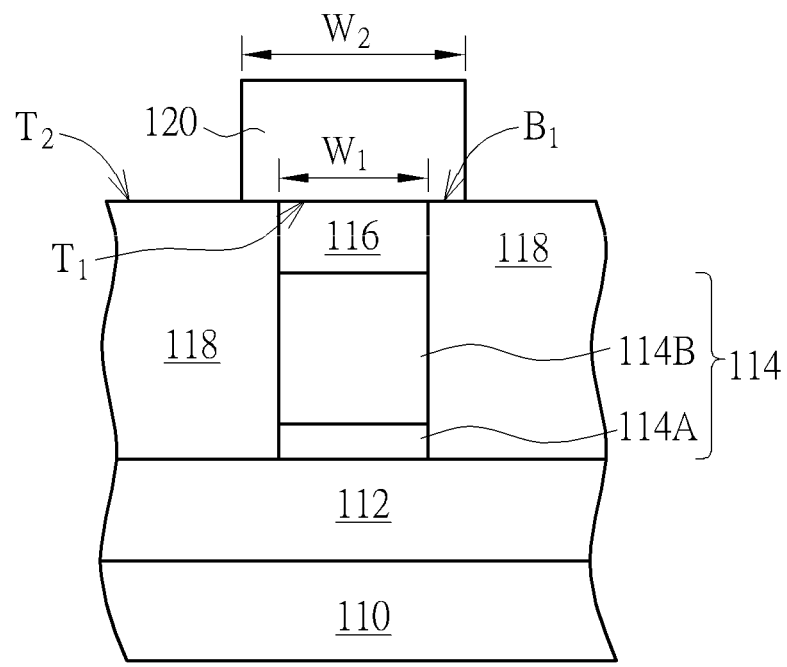

As shown in FIG. 6, a second hard mask 120 is formed on the planarized first hard mask 116 and the dielectric layer 118. Therefore, a bottom surface B1 of the second hard mask 120, a top surface T1 of the first hard mask 116, and a top surface T2 of the dielectric layer 118 are on the same level. The method for forming the second hard mask 120 may include: first, a second hard mask material layer (not shown) is entirely formed on the first hard mask 116 and on the dielectric layer 118. Afterwards, an exposure process, a development process and an etching process are then performed, so as to remove parts of the second hard mask material layer, and to form the second hard mask 120. It is noteworthy, as shown FIG. 6, the width W2 of the second hard mask 120 is larger than the width W1 of the first hard mask 116. In addition, the area of the second hard mask 120 is larger than the area of the first hard mask 116 too. Besides, the second hard mask 120 and the first hard mask 116 are made of different materials, and have different etching selectivity. Preferably, the etching rate for etching the second hard mask 120 is slower than the etching rate for etching the first hard mask 116 during the following etching process. For example, the material of the second hard mask 120 is nitrogen silicon carbide (SiCN), the material of the first hard mask 116 is silicon oxide, and the etching selectivity of the first hard mask 116 to the second hard mask 120 is preferably larger than 5. In this way, ensuring the second hard mask 120 will not to be over-etched or destroyed during the following etching processes, and to protect other elements disposed under the second hard mask 120.

Figure 7:
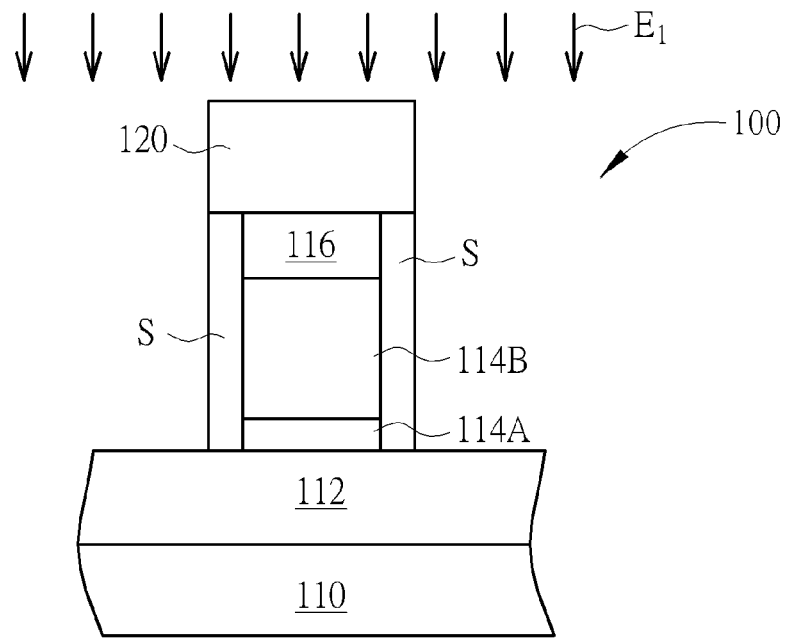

Afterwards, as shown in FIG. 7, the second hard mask 120 is used as a hard mask (a protecting layer), and an etching process E1 is then performed, so as to remove parts of the dielectric layer 118, and expose the surfaces of the fin structure 112 disposed on two sides of the gate structure 114. It is noteworthy that after the etching process E1 is performed, the remaining dielectric layer is defined as a spacer S (as shown in FIG. 7), wherein the spacer S disposed right below the second hard mask 120, and contacts two sidewalls of the gate structure 114 directly. Preferably, the spacer S has a vertical edge that is perpendicular to the top surface of the fin structure 112. Except for the spacer S, other parts of the dielectric layer 118 are completely removed during the etching process E1, including the dielectric layer remaining on the substrate 110 that is disposed on two sides of the fin structure 112. In addition, the etchant which is used in the etching process E1 has a faster etching rate to the dielectric layer 118, but can hardly etch the second hard mask 120. Therefore, after the etching process E1 is performed, the second hard mask 120 will not be destroyed, and the second hard mask 120 still covers the top surface of the first hard mask 116.

Figure 8:
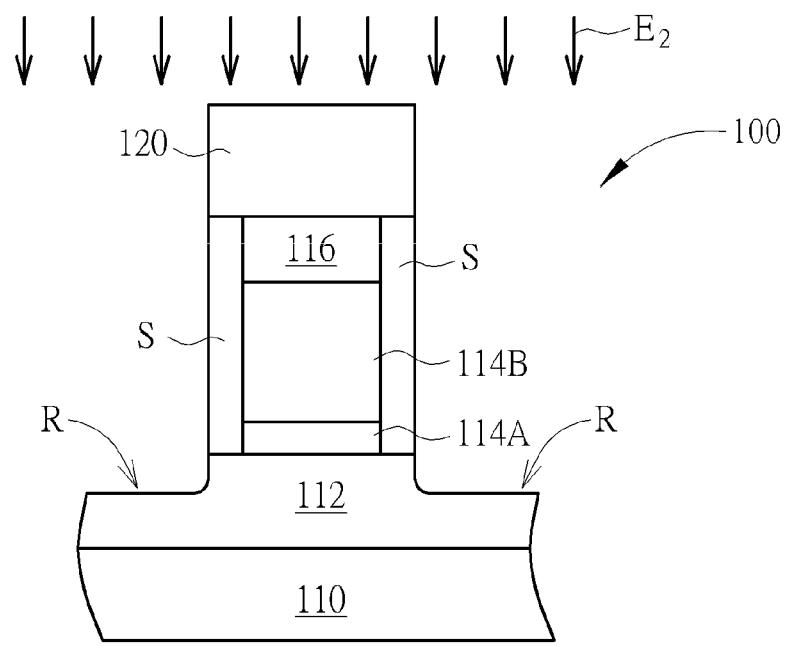

As shown in FIG. 8, an etching process E2 is performed to etch a part of the fin structure 112 beside the gate structure 114, so that a recess R in the fin structure 112 is formed on either side of the gate structure 114 respectively. In the present invention, the etching process E2 may include a dry etching process or a wet etching process. In a preferred embodiment, the etching process E2 may include a dry etching process and a wet etching process, or at least one wet etching process. In one case, the wet etching process comprises etching by an etchant containing ammonia, hydrogen peroxide and water, which performs at least an etching process to form the recess R using the characteristic of different etching rates applied to various crystal planes of the fin structure 112. Furthermore, the desired shape of the recess R can be attained by adjusting the ratio of ammonia, hydrogen peroxide and water in the etchant. In another embodiment, the recess R may be obtained by performing a wet etching process one or more times using different etchants, wherein the etchants may be ammonia etchant, methyl ammonium hydroxide etchant, hydroxide etchant, or ethylene diamine pyrocatechol etchant, etc. Therefore, the present invention can form the recess R having a hexagon-shaped profile structure.

Figure 9:
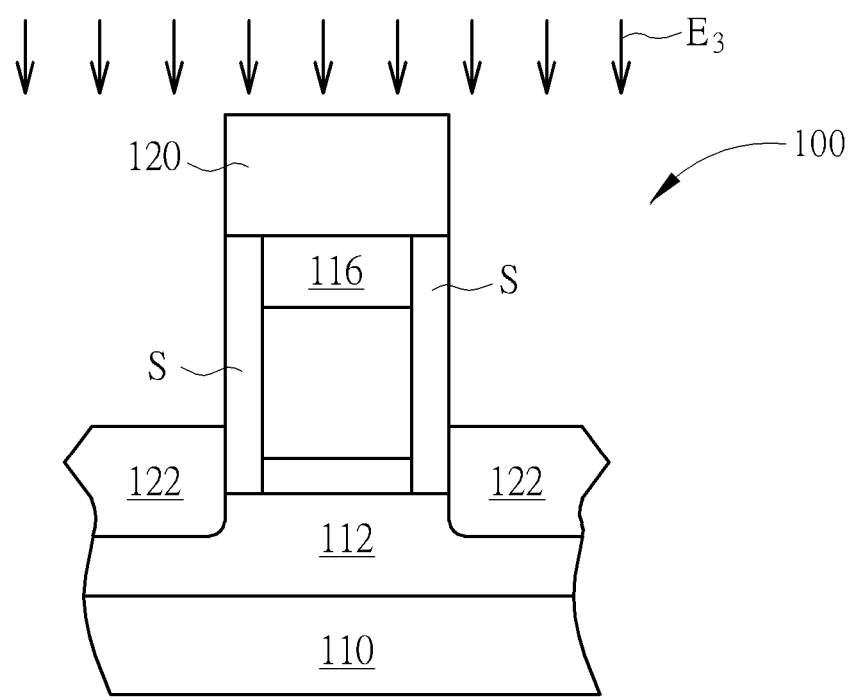

As shown in FIG. 9, an epitaxial process E3 is performed to form an epitaxial layer 122 having a hexagon-shaped profile structure in the recess R. The epitaxial layer 122 may include a silicon-germanium epitaxial layer suited for a PMOS transistor, or a silicon-carbide epitaxial layer suited for an NMOS transistor. Thereafter, an ion implantation process may be performed to dope impurities, or impurities may be doped while performing the epitaxial process E3, so that the epitaxial layer 122 can be used as a source/drain region. After the epitaxial layer 122 is formed, a silicide process (or a salicide process, not shown) may be performed to form silicide in the source/drain region, wherein the silicide process may include a post clean process, a metal depositing process, an annealing process, a selective etching process, or a test process, etc. Thereafter, other processes may be performed after the silicide process is performed, such as after the dielectric layer is formed, and then forming the contact structures.

In conventional technologies, when forming the spacers disposed on two sides of the gate structure, the gate structure is easily destroyed caused by over-etching. However, if decreasing the etching time, some dielectric layer will easily remain on the substrate. In order to solve the issues mentioned above, one method usually used is increasing the height of the hard mask which is disposed on the gate structure. Therefore, even when increasing the etching time, the dielectric layer can still be removed clearly. However, the method mentioned above also increases the difficulty of the process and reduces the yield. The feature of the present invention is besides the conventional hard mask, further comprising a wider second hard mask on the top surface of the hard mask. The second hard mask not only protects the gate structure disposed below effectively, and ensures the dielectric layer which remains on the substrate can be removed clearly, but also allows controlling the width of the spacer disposed on two sides of the gate structure by adjusting the width of the second hard mask. Therefore, compared with conventional process, the height of hard mask does not need to be increased, but the issues can be solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor structure, at least comprising the following steps:
    providing a substrate, a fin structure disposed on the substrate, and a gate structure crossing the fin structure, a first hard mask being disposed on the top surface of the gate structure, wherein the gate structure only covers parts of the fin structure;
    forming a dielectric layer, covering the substrate, the fin structure and the gate structure;
    forming a second hard mask on the top surface of the first hard mask, wherein the width of the second hard mask is larger than the width of the first hard mask, and a bottom surface of the second hard mask, a top surface of the first hard mask, and a top surface of the dielectric layer are on a same level;
    performing an etching process, to remove parts of the dielectric layer and remove parts of the fin structure; and
    forming an epitaxial layer in the fin structure, wherein the second hard mask still exists on the top surface of the first hard mask after the epitaxial layer is formed.

2. The method of claim 1, wherein after the etching process is performed, except for the dielectric layer which is disposed right below the second hard mask and on two sides of the gate structure, other parts of the dielectric layer are removed entirely.

3. The method of claim 2, wherein after the etching process is performed, the dielectric layer which does not be removed is defined as at least one spacer.

4. The method of claim 3, wherein the spacer has a vertical edge.

5. The method of claim 1, wherein after removing parts of the fin structure, at least one recess is formed in fin structure on two sides of the gate structure.

6. The method of claim 5, wherein the epitaxial layer is disposed in each recess.

7. The method of claim 6, wherein the material of the epitaxial layer comprises silicon-germanium or silicon-carbide.

8. The method of claim 1, wherein after the etching process is performed, the second hard mask is disposed on the top surface of the first hard mask.

9. The method of claim 1, wherein after the dielectric layer is formed, the dielectric layer covers the top surface of the first hard mask.

10. The method of claim 9, further comprising performing a planarization process, to remove parts of the dielectric layer, and to expose the top surface of the first hard mask, and the second hard mask then being formed on the top surface of the first hard mask.

11. The method of claim 1, wherein the etching selectivity of the first hard mask to the second hard mask is larger than 5.

12. The method of claim 1, wherein the material of the first hard mask comprises silicon oxide.

13. The method of claim 1, wherein the material of the second hard mask comprises nitrogen silicon carbide.

14. The method of claim 1, wherein the first hard mask has a first height, the gate structure has a second height, and the ratio of the first height to the second height is smaller than/equal to 0.3.

* * * * *